United States Patent
Xie et al.

(10) Patent No.: US 9,461,134 B1
(45) Date of Patent: Oct. 4, 2016

(54) METHOD FOR FORMING SOURCE/DRAIN CONTACT STRUCTURE WITH CHALCOGEN PASSIVATION

(71) Applicant: ASM IP Holding B.V., Almere (NL)

(72) Inventors: Qi Xie, Leuven (BE); Fu Tang, Gilbert, AZ (US); Petri Raisanen, Gilbert, AZ (US); Jacob Woodruff, Scottsdale, AZ (US); Jan Willem Maes, Wilrijk (BE); Michael Givens, Scottsdale, AZ (US)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/717,553

(22) Filed: May 20, 2015

(51) Int. Cl.
*H01L 21/44* (2006.01)
*H01L 29/45* (2006.01)
(Continued)

(52) U.S. Cl.
CPC .......... *H01L 29/45* (2013.01); *H01L 21/0228* (2013.01); *H01L 21/02186* (2013.01); *H01L 21/28556* (2013.01); *H01L 21/28568* (2013.01); *H01L 23/29* (2013.01); *H01L 23/3171* (2013.01); *H01L 29/0847* (2013.01); *H01L 29/16* (2013.01); *H01L 29/66477* (2013.01)

(58) Field of Classification Search
CPC ... H01L 29/45; H01L 29/0847; H01L 29/16; H01L 29/66477; H01L 21/02186; H01L 21/0228; H01L 21/28556; H01L 21/28568; H01L 23/29; H01L 23/3171
USPC .......................... 438/680, 681, 257, 263, 264
See application file for complete search history.

(56) References Cited

U.S. PATENT DOCUMENTS 4,354,198 A 10/1982 Hodgson et al.
4,751,200 A 6/1988 Gmitter et al.
(Continued)

FOREIGN PATENT DOCUMENTS

| EP | 0 265 314 A1 | 4/1988 |
| EP | 2 068 368 A2 | 6/2009 |
| WO | WO 03/019691 A2 | 3/2003 |

OTHER PUBLICATIONS

Hsueh. Alternative Materials for Next-Generation Transistors: High-k/Ge based MOSFET. Dissertation submitted to the Graduate School—New Brunswick Rutgers, The State University of New Jersey, pp. 1-158, 2008.
(Continued)

*Primary Examiner* — Kevin M Picardat
(74) *Attorney, Agent, or Firm* — Knobbe, Martens, Olson & Bear LLP

(57) ABSTRACT

In some embodiments, an MIS-type contact structure is formed by passivating the semiconductor surface of a source/drain region with a chalcogen, and subsequently depositing an tunnel layer by first exposing the chalcogen-passivated surface to a metal-organic precursor. Subsequently, deposition of the tunnel layer continues to a desired thickness. Preferably, the metal-organic precursor is part of a first set of ALD precursors and a second set of ALD precursors, which include one or more metal or semimetal precursors, are subsequently used to continue the deposition. For example, the metal-organic precursor may be used to deposit a first portion of the tunnel layer, and an inorganic metal or inorganic semimetal precursor or a different organic metal or organic semimetal precursor may be used to deposit a second portion of the tunnel layer. A metal is subsequently deposited on the tunnel layer, e.g., to form a metal electrode or electrical contact.

23 Claims, 2 Drawing Sheets

(51) Int. Cl.
*H01L 21/02* (2006.01)
*H01L 21/285* (2006.01)
*H01L 29/16* (2006.01)
*H01L 29/08* (2006.01)
*H01L 29/66* (2006.01)
*H01L 23/31* (2006.01)
*H01L 23/29* (2006.01)

(56) References Cited

U.S. PATENT DOCUMENTS

| | | | |
|---|---|---|---|
| 5,124,278 | A | 6/1992 | Bohling et al. |
| 5,168,077 | A | 12/1992 | Ashizawa et al. |
| 5,393,680 | A | 2/1995 | Shikata |
| 5,451,542 | A | 9/1995 | Ashby |
| 5,760,462 | A | 6/1998 | Barron et al. |
| 6,117,720 | A | 9/2000 | Harshfield |
| 6,150,253 | A | 11/2000 | Doan et al. |
| 6,207,976 | B1 | 3/2001 | Takahashi et al. |
| 6,380,097 | B1 | 4/2002 | Dauplaise et al. |
| 6,534,368 | B2 | 3/2003 | Zahorik |
| 6,635,951 | B1 | 10/2003 | Zahorik |
| 6,670,651 | B1 | 12/2003 | Braddock |
| 6,709,958 | B2 | 3/2004 | Li et al. |
| 6,710,423 | B2 | 3/2004 | Moore et al. |
| 6,727,192 | B2 | 4/2004 | Moore et al. |
| 6,730,547 | B2 | 5/2004 | Li et al. |
| 6,734,455 | B2 | 5/2004 | Li |
| 6,791,125 | B2 | 9/2004 | Demkov et al. |
| 6,812,087 | B2 | 11/2004 | Giltom et al. |
| 7,094,651 | B2 | 8/2006 | Mitzi et al. |
| 7,094,700 | B2 | 8/2006 | Li et al. |
| 7,307,277 | B2 | 12/2007 | Frey et al. |
| 7,341,960 | B2 | 3/2008 | Lee et al. |
| 7,394,088 | B2 | 7/2008 | Lung |
| 7,619,248 | B1 | 11/2009 | Cleeves |
| 7,678,708 | B2 | 3/2010 | Vaartstra et al. |
| 7,964,490 | B2 | 6/2011 | Clendenning et al. |
| 8,309,163 | B2 * | 11/2012 | Van Duren ......... C23C 18/1204 427/376.1 |
| 8,796,125 | B2 | 8/2014 | Rockenberger et al. |
| 2002/0106849 | A1 | 8/2002 | Moore |
| 2007/0111429 | A1 | 5/2007 | Lung |
| 2007/0238247 | A1* | 10/2007 | Ou ................ H01L 21/02568 438/257 |
| 2008/0006930 | A1 | 1/2008 | Ichida |
| 2008/0083924 | A1 | 4/2008 | Song et al. |
| 2008/0272355 | A1 | 11/2008 | Cho et al. |
| 2010/0072451 | A1 | 3/2010 | Terao et al. |
| 2010/0203672 | A1 | 8/2010 | Eun et al. |
| 2011/0147795 | A1* | 6/2011 | Rachmady ............ H01L 29/513 257/192 |
| 2013/0270505 | A1 | 10/2013 | Dahmani |
| 2014/0027884 | A1 | 1/2014 | Tang |

OTHER PUBLICATIONS

Ikeda et al. Modulation of NiGe/Ge Schottky barrier height by sulfur segregation during Ni germanidation. Applied Physics Letters (88)152115: 1-3. 2006.

Kaxiras. Semiconductor-surface restoration by valence-mending adsorbates: Application to Si(100):S and Si(100):Se. Physical Review B (43)8: 6824-6827. 1991.

Leskelä et al. Atomic layer deposition (ALD): from precursors to thin film structures. Thin Solid Films (409): 138-146, 2002.

Lin. Low Resistance Contacts to N-Type Germanium. Dissertation submitted to the Department of Electrical Engineering and the Committee on Graduate Studies of Stanford University, pp. 1-136, 2013.

Maeda et al. Sulfur passivation of Ge (001) surfaces and its effects on Schottkey Barrier contact. Materials Science in Semiconductor Processing (9):706-710. 2006.

Tao et al. Low Schottky barriers on *n*-type silicon (001). Applied Physics Letters (83)13: 2593-2595. 2003.

Thatchary et al. Fermi level depinning at the germanium Schottky interface through sulfur passivation. Applied Physics Letters (96)152108: 1-4. 2010.

* cited by examiner

US 9,461,134 B1

METHOD FOR FORMING SOURCE/DRAIN CONTACT STRUCTURE WITH CHALCOGEN PASSIVATION

BACKGROUND

1. Field

This disclosure relates to semiconductor processing and, more particularly, to forming source/drain contact structures for transistors.

2. Description of the Related Art

As the dimensions of semiconductor devices in integrated circuits become ever smaller, the sizes of the constituent parts of these devices are also becoming smaller. For example, the sizes of transistors are continually decreasing, leading to decreases in the sizes of transistor source/drain regions. These smaller source/drain regions provide a smaller contact area for the source/drain contacts that electrically connect the source/drain regions to other electrical features. Smaller contact areas, however, can cause undesirable increases in contact resistance. Consequently, there is a need for methods of forming source/drain contact structures with low contact resistance.

SUMMARY

In one aspect, a method is provided for integrated circuit fabrication. The method includes forming a transistor source/drain contact structure having a dielectric tunnel layer and a metal by performing the following sequence in order: passivating a surface of a semiconductor substrate by exposing the surface to a chalcogen, thereby forming a chalcogen-passivated surface; exposing the chalcogen passivated surface to a metalorganic precursor; depositing the tunnel layer; and depositing the metal over the tunnel layer. Depositing the tunnel layer includes exposing the chalcogen passivated surface to a metalorganic precursor and subsequently depositing a remaining portion of the tunnel layer without the metal-organic precursor.

In another aspect, a method is provided for integrated circuit fabrication. The method includes forming a transistor by forming a source/drain contact structure over a semiconductor substrate. Forming the source/drain contact structure includes exposing a source/drain region of the transistor to a chalcogen; depositing a dielectric tunnel layer on the chalcogen-exposed source/drain region; and forming a metal electrode over the dielectric layer. Depositing the dielectric layer includes exposing the substrate to a metal-organic precursor and subsequently depositing a remainder of the dielectric layer by exposing the substrate to a plurality of precursors different from the first metal-organic precursor.

DETAILED DESCRIPTION

Figure 1:
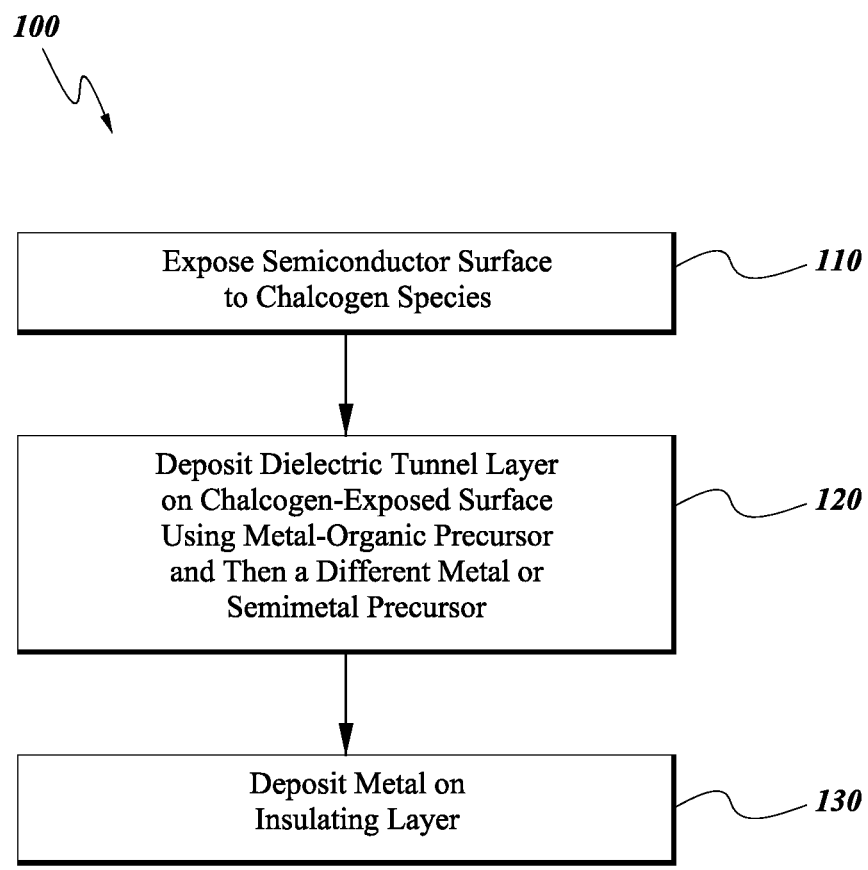
FIG. 1 is a flow chart generally illustrating a process for forming source/drain contact structures, according to some embodiments.

The contact resistance between a source/drain contact structure and a source/drain region can be reduced by reducing contact resistivity. Without being limited by theory, it is believed that one phenomenon causing high contact resistivity is Fermi level pinning at the semiconductor valence band edge. This Fermi level pinning is believed to occur for many of the source/drain contact metals used to contact the semiconductor that forms the source/drain regions. The result is a high Schottky Barrier Height (SBH). Consequently, decreasing Fermi level pinning is believed to provide one approach to reduce contact resistivity.

Metal-Insulator-Semiconductor (MIS) structures have been proposed as one way to accomplish Fermi level depinning. These MIS structures include a thin dielectric film serving as a tunnel layer between the semiconductor material of the source/drain region and the metal contact, thereby typically forming a contact structure with a semiconductor (the source/drain region), a tunnel layer over and in contact with the semiconductor, and a metal over and in contact with the tunnel layer. The thin tunnel layer is believed to cause depinning of the Fermi level and a reduction of the SBH. The thin tunnel layer also adds to the resistance between the semiconductor and the metal. Nevertheless, by reducing the SBH, an overall reduction in contact resistivity may be obtained using a sufficiently thin tunnel layer.

It has been found, however, that MIS structures may still have an undesirably high contact resistivity. For example, $TiO_2$ has been investigated as a tunnel layer for these MIS structures since it exhibits negligible conduction band offset with respect to either Ge or Si. However, the contact resistivity obtained in a $Ti/TiO_2$/n-Ge MIS system was found to be greater than $1\times10^{-7}$ $cm^{-2}$, which is still higher than desired for some applications. For example, this resistivity is two orders of magnitude higher than the target for the 10 nm process node.

Chalcogen passivation of the semiconductor surface of the source/drain region has been proposed (e.g., Thathachary et al., "Fermi level depinning at the germanium Schottky interface through sulfur passivation," Appl. Phys. Lett. 96, 152108, 2010) as another approach for decreasing contact resistivity. Without being limited by theory, it is believed that the chalcogen passivation also reduces contact resistivity by decreasing Fermi level pinning.

Chalcogen passivation of the semiconductor surface, however, can make formation of a source/drain structure difficult because the chalcogen passivation makes this surface highly inert and difficult to deposit material on. This difficulty can make the formation of MIS-type contact structures particularly challenging, since the quality (including the uniformity and thickness) of the tunnel layer formed in contact with passivated surface has a direct impact on the electrical properties of the source structure. Two possible processes for depositing material are atomic layer deposition (ALD), which deposits material by adsorbing sequentially precursors on the substrate surface, and chemical vapor deposition (CVD), which deposits material by decomposing precursors. For ALD, it can be difficult to adsorb precursors on the inert passivated surface. This poor adsorption and the repeated cycling of ALD may lead to poor process results and uniformity, and relatively low throughput. Moreover, common ALD precursors, such as precursors that include halides, may destroy or remove material, including the chalcogen passivation itself. On the other hand, CVD processes can be hard to control due to difficulties controlling the decomposition of precursors. This poor control over decomposition may lead to poor control over the deposition, thereby causing poor process results. Moreover, where CVD precursors include carbon, the decomposition of CVD precursors can cause undesirable incorporation of carbon impurities in the dielectric film.

In accordance with embodiments disclosed herein, source/drain contact structures may be formed having a low resistivity and high uniformity. In some embodiments, an MIS-type contact structure is formed by passivating the semiconductor surface of a source/drain region with a chalcogen, and subsequently depositing a tunnel layer by first exposing the chalcogen-passivated surface to a metal-organic precursor (a metal with an attached organic ligand) and then depositing a remaining portion of the tunnel layer without the metal-organic precursor. A metal is subsequently deposited on the tunnel layer, e.g., to form a metal electrode or electrical contact.

In some embodiments, after one or a plurality of exposures of the chalcogen-passivated surface to the metal-organic precursor and before forming the metal electrode or electrical contact, deposition of the tunnel layer continues to a desired thickness without the metal-organic precursor. In some embodiments, the deposition continues using one or more metal precursors, including one or more metal-organic precursors or inorganic metal precursors, which are different from the metal-organic precursor to which the chalcogen-passivated surface was first exposed. In some embodiments, the deposition continues using one or more semimetal precursors, including semimetal-organic precursors or inorganic semimetal precursors. Preferably, the first metal-organic precursor is part of a first set of ALD precursors and a second set of ALD precursors that include one or more different metal or semimetal precursors are subsequently used to continue the deposition. In some embodiments, the second set of ALD precursors includes precursors that are not metal-organic precursors. For example, the metal-organic precursor may be used to deposit a first portion of the tunnel layer, and another metal precursor, e.g. an inorganic metal precursor (which does not include any organic ligand), or an inorganic semimetal precursor may be used to deposit a second portion of the tunnel layer. Preferably, the MIS contact structure includes a metal that directly contacts the tunnel layer, which in turn directly contacts the passivated semiconductor surface of the source/drain region. In some embodiments, the first metal-organic precursor is the only precursor in the first set of precursors, and the deposition subsequently proceeds with a second set of precursors that include ALD precursors.

Whereas other precursors may have difficulty nucleating on the inert chalcogen-passivated surface, it has been found that metal-organic precursors may effectively react with and deposit on the chalcogen. Without being limited by theory, the metal is believed to strongly bond to the chalcogen while having a weaker bond to an organic ligand on the side of the metal opposite the chalcogen. The ligand may be relatively easily removed, thereby facilitating the subsequent deposition of the remaining desired thickness of the tunnel layer. Other sets of precursors, e.g., including inorganic metal or semimetal precursors without the metal-organic precursor, may be used for the subsequent deposition. In some embodiments, these inorganic metal or semimetal precursors may be desirable to avoid the possibility of incorporating carbon in the tunnel layer. In some embodiments, a minority of the thickness of the tunnel layer is formed using the metal-organic precursors (e.g., fewer than 5 ALD cycles may be performed with the metal-organic precursor) to which the chalcogen is first exposed during the tunnel layer deposition. In some embodiments, only a single exposure to the metal-organic precursor is used, as only the single exposure may be needed to prepare the chalcogen-passivated surface for the subsequent deposition of the remaining dielectric material. In some embodiments, the deposition of the remaining dielectric material may be performed using a metal-organic precursor that is the same or different from the metal-organic precursor to which the chalcogen-passivated surface is first exposed during the deposition of the tunnel layer.

Advantageously, MIS contact structures formed according to some embodiments may have exceptionally low contact resistivity. For example, the contact resistivity may be about $10^{-7}$ $\Omega cm^2$ or less (including about $10^{-9}$ $\Omega cm^2$ to about $10^{-7}$ $\Omega cm^2$). Moreover, the atomic layer depositions disclosed herein may provide highly uniform tunnel layers for the tunnel layer portion of the MIS contact structure. A high degree of thickness uniformity may be provided by the initial exposure of the chalcogen-passivated surface to the metal-organic precursor. In addition, the metal-organic precursor may avoid destruction of the chalcogen-passivated surface. It will be appreciated that these factors can facilitate the formation of MIS contact structures having high uniformity in physical dimensions and composition, which can facilitate high uniformity in electrical properties, including low contact resistivity.

Reference will now be made to the drawings, which are schematic and not necessarily drawn to scale.

FIG. 1 is a flow chart generally illustrating a process 100 for forming source/drain contact structures, according to some embodiments. At block 110, the surface of a semiconductor is exposed to a chalcogen species. It will be appreciated that the semiconductor may be part of a semiconductor substrate. As used herein, a semiconductor substrate is a substrate that is at least partially formed of semiconductor material. The semiconductor material may be one or more of silicon, germanium, silicon germanium, a III-V semiconductor, a II-VI semiconductor, or a 2D semiconductor material such as molybdenum sulfide (MoS) or graphene. For example, in some embodiments, the semiconductor substrate may be a semiconductor wafer, or may be a semiconductor wafer having overlying conductive and/or dielectric materials. In some embodiments, the substrate may be a silicon wafer containing one or more of a germanium layer, a silicon germanium layer, and a III-V semiconductor layer. Thus, the exposed semiconductor surface exposed to the chalcogen species may include silicon, germanium, silicon and germanium, a III-V semiconductor, a II-VI semiconductor, or a 2D semiconductor material such as MoS or graphene. The III-V semiconductor may contain Ga and As in some embodiments.

Preferably, the exposed semiconductor surface is the surface of a doped semiconductor region that forms a source/drain region for a transistor. For example, the source/drain region may be formed of an n-doped semiconductor.

With continued reference to FIG. 1 and block 110, the chalcogen species may include one or more of a sulfur compound, a selenium compound, or a tellurium compound. Examples of such compounds include, without limitation, $H_2S$, $H_2Se$, and $H_2Te$, respectively. In some embodiments, the semiconductor surface may be exposed to the chalcogen species for a duration of about 1 second to about an hour (for example, about 1 second to about 10 minutes). Gas containing the chalcogen species maybe flowed into a process chamber containing the semiconductor substrate at a flow rate of about 10 sccm to about 1000 sccm, at a process temperature of about 20° C. to about 400° C. In some embodiments the process temperature may be about 50-350° C., about 150-350° C., or about 150-300° C. The chalcogen species preferably passivates the exposed semiconductor surface, and overexposure of the surface to the chalcogen species is well tolerated.

With continued reference to FIG. 1, at block 120, a tunnel layer is deposited on the chalcogen-exposed surface using a first metal precursor which is a metal-organic precursor and a second, different metal precursor, which may be a metal-organic precursor or an inorganic metal precursor, or a semimetal precursor. As used herein, a metal-organic precursor is a metal precursor with at least one attached organic chemical species (e.g., an organic ligand), while an inorganic metal precursor has at least one attached inorganic chemical species (e.g., an inorganic ligand) and no attached organic species. As described herein, the chalcogen-exposed surface is exposed to the metal-organic precursor before the second metal precursor, e.g. the inorganic metal precursor, is introduced. Without being limited by theory, it is believed that the metal-organic precursor absorbs on the surface of the chalcogen-exposed surface in a self-limiting manner. In some embodiments, about a monolayer or less of the metal-organic precursor is deposited on the chalcogen-exposed surface per exposure to the metal-organic precursor.

Preferably, the metal-organic precursor and inorganic metal precursor are ALD precursors and the tunnel layer is deposited by ALD. For ALD, the substrate surface to be deposited upon may be alternatingly exposed to mutually reactive precursors, with a deposition cycle including absorption of a first precursor on the deposition surface and then reaction of the absorbed precursor with a second mutually reactive precursor to form a "monolayer" of a reaction product. The deposition cycles are repeated and the monolayers are deposited over one another until the deposited material reaches a total desired thickness. In some embodiments, the alternating exposure is accomplished by flowing precursors in temporally separated pulses into a process chamber that accommodates the substrate. In some other embodiments, the alternating exposures or pulses may be accomplished by movement of the substrate and/or reactor parts, without stopping and starting the flow of precursors into the deposition chamber to accomplish the alternating exposures. In some embodiments, precursors in the process chamber may be removed, e.g., by purging with inert gas and/or by evacuation of the chamber, between exposures of the substrate to the precursor species.

In some embodiments, the metal of the metal-organic precursor forms a chemical bond with the chalcogen while the opposite side of the metal includes a ligand that is exposed. Over the course of the deposition, the ligand is removed (e.g., hydrolyzed) and a bond is formed between the metal and dielectric precursor. As used herein, the dielectric precursor is a precursor that reacts with the metal to form a dielectric material. In some embodiments, the dielectric precursor is an oxygen precursor, an oxygen-containing chemical species which forms a metal oxide with the metal. In some other embodiments, the dielectric precursor is a nitrogen precursor or a chalcogen precursor, such as a sulfur precursor which forms a metal sulfide. Consequently, a "monolayer" of a metal-containing dielectric may be formed.

As discussed herein, in some embodiments, only a single monolayer of the dielectric material is formed with the metal-organic precursor before forming the remainder of the tunnel layer with a different metal precursor. For example, the chalcogen-passivated surface may be exposed only to a single pulse of the metal-organic precursor and a single pulse of the dielectric precursor before continuing deposition of the tunnel layer using a different metal precursor. In some other embodiments, the chalcogen-passivated surface may be exposed to multiple deposition cycles that each includes a pulse of the metal-organic precursor and a pulse of the dielectric precursor. In some other embodiments, the metal-organic precursor is not reacted with a dielectric precursor; rather, the second metal precursor is introduced to react directly with the metal-organic precursor in place of the dielectric precursor. In other embodiments, the tunnel layer may include multiple different metals. For example, the tunnel layer may be formed of strontium titanium oxide (SrTiO), aluminum-doped zinc oxide (AlZnO), or gallium-doped zinc oxide (GaZnO).

In some embodiments, the same metal is present in both the metal-organic precursor and the second metal precursor, and/or the dielectric precursor may also be the same throughout the deposition of the tunnel layer. Use of the same dielectric precursor to react with both the metal-organic precursor and the inorganic metal precursor may provide advantages for processing simplicity by reducing the number of precursors and associated systems for delivering the precursors to the process chamber. In some embodiments, the metal and/or the dielectric precursor may vary over the course of the deposition of the tunnel layer, which may provide advantages for providing a tunnel layer with a particularly tailored composition.

In some embodiments, after initially exposing the chalcogen-passivated surface to the metal-organic precursor, a dielectric that includes a semimetal, such as silicon or germanium, is deposited to form the remainder of the tunnel layer. For example, a silicon nitride (SiN) or a germanium nitride (GeN) is deposited to form the remainder of the tunnel layer in some embodiments. The SiN or GeN may be deposited by ALD using a silicon or germanium precursor, preferably an inorganic silicon or germanium precursor, and a nitrogen precursor in some embodiments.

In some embodiments, the relative ratios of pulses of the metal or semimetal precursors and the dielectric precursor may be varied over the course of the deposition. For example, a tunnel layer with a graded composition may be formed. For example, the number of pulses of metal or semimetal precursor per pulse of dielectric precursor may increase as the tunnel layer grows, thereby forming a layer with a higher proportion of metal or semimetal towards the top of the layer than towards the bottom of the layer. In some other embodiments, the ratios of the pulses of the metal precursors and the dielectric precursors are kept constant over the course of the deposition to form a tunnel layer having a consistent composition with height.

Examples of metals for the metal-organic and inorganic metal precursors include titanium, strontium, zinc, magnesium, gallium, indium, tin, nickel and aluminum. To form tunnel layers, these metals may be reacted with a dielectric precursor to form a dielectric, as discussed herein. For example, they may react with an oxygen precursor to form their respective oxides, including titanium oxide, strontium oxide, zinc oxide, magnesium oxide, indium oxide, tin oxide, nickel oxide, and aluminum oxide. Nickel oxide is a particularly good option in some embodiments for a p-type contact, due to good valence band alignment. Examples of titanium-organic precursors include: trimethyloxide titanium (TMOT); triisopropoxide titanium (TTIP); tetrakis (dimethylamino)titanium(IV); and titanium(IV) methoxide. An example of an inorganic titanium precursor is $TiCl_4$. Examples of strontium-organic precursors include bis(tris-butylcyclopentadienyl)strontium (($tBu_3Cp)_2Sr$); and (bis (tris-butylcyclopentadienyl)strontium. Examples of zinc-organic precursors include dimethylzinc or diethylzinc. An example of a magnesium-organic precursor includes (bis (cyclopentadienyl)magnesium ((Cp)$_2$Mg). An example of an indium precursor includes indium acetylacetonate (In(A-CAC)$_3$). Preferably, the metal-organic precursor forms a tight bind with the chalcogen-passivated surface and its ligands can be easily hydrolyzed. Advantageously, the growth may be self-limiting and the easy removal of the organic ligands may form a film with low levels or no apparent carbon incorporation. Other examples of inorganic metal precursors include halides of the above-noted metals, including TiBr$_3$, AlCl$_3$, GaCl$_3$, InCl$_3$, MgCl$_2$.

In some embodiments, after one or more exposures to a metal-organic precursor, whether alone or as part of ALD deposition cycles with a dielectric precursor, the remainder of the tunnel layer may be formed of a metal sulfide. For such layers, examples of metals for the metal of the metal sulfide thin film include: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, W, or combinations thereof.

In some embodiments, the semiconductor surface may be exposed to metal-organic precursors, inorganic metal precursors, or inorganic semimetal precursors in one or more pulses, each pulse having a duration of about 0.1 second to 1 minute (for example, about 0.1-10 seconds, about 0.1-5 seconds, or about 2-5 seconds in some embodiments). In some embodiments, the process temperature may be about 50-400° C., about 150-350° C., about 150-300° C., or about 200-350° C. It will be appreciated that the deposition conditions may change depending on the precursors used. For example, depositions using the metal-organic precursor may occur under different process conditions than depositions using the inorganic metal precursor.

Examples of dielectric precursors that are oxygen precursors include H$_2$O, H$_2$O$_2$, O$_2$, O$_3$, alcohols, O$_2$ plasma, and carboxylic acids. Examples of dielectric precursors that are nitrogen precursors include ammonia, hydrazine, hydrazine derivatives, and nitrogen plasma. Examples of dielectric precursors that are sulfur precursors include H$_2$S. In some embodiments, the deposition cycles of inorganic metal precursor and dielectric precursor are repeated until the tunnel layer reaches a thickness of about 0.5-5 nm, including about 0.5-3 nm, about 1-3 nm, or about 2-3 nm.

With continued reference to FIG. 1, at block 130 a metal is deposited on the tunnel layer. The metal forms the "M" portion of the MIS-type contact structure and may function as part of an electrical contact with other electronic circuitry. In some embodiments, the metal may be titanium, aluminum, nickel, or combinations thereof, including titanium and aluminum. These metals may be deposited by various methods including, for example, vapor deposition processes such as ALD using self-limiting depositions of titanium or aluminum precursors, whether or not activated by a plasma, or physical deposition processes including sputtering and e-beam evaporation. It will be appreciated that other materials may subsequently be deposited. In some embodiments, the metal may be titanium and titanium nitride (TiN) may subsequently be deposited on the metal. As an example, the MIS contact structure may include an n-doped germanium source/drain region (as the "S" portion of the contact structure) having a surface passivated by exposure to H$_2$S; an tunnel layer formed by titanium oxide (TiO$_2$) (as the "I" portion of the contact structure); a metal layer formed of titanium (as the "M" portion of the contact structure); and a titanium nitride (TiN) layer over the titanium.

In some embodiments, each of blocks 110, 120, and 130 may be performed in the same process chamber, e.g., a single-substrate process chamber. In some other embodiments, blocks 120 and 130 may be performed in different chambers, e.g., different chambers in a cluster tool. Advantageously, the oxide deposition of block 120 can provide increased process latitude, since the oxide can make the substrate surface less sensitive to the external ambient outside the process chamber, thereby allowing the substrate to be transported to another process chamber without significant undesired reactions with the external ambient. It will be appreciated that transport between dedicated process chambers for specific depositions may facilitate high quality deposition results.

Figure 2:
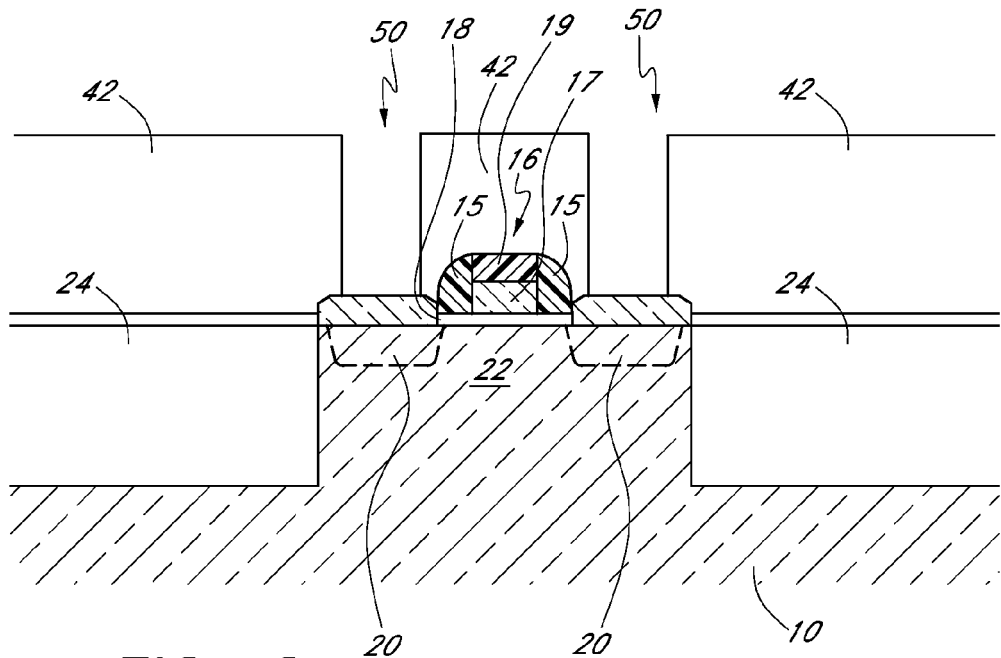
FIG. 2 shows a schematic cross-section of a transistor structure before forming a source/drain contact structure, according to some embodiments.

FIG. 2 shows a schematic cross-section of a transistor structure before forming a source/drain contact structure, according to some embodiments. Substrate 10 includes a semiconductor, which can form an active area 22 between field isolation regions 24, which can be formed by conventional shallow trench isolation (STI) techniques, in some embodiments. Alternatively, any suitable method can be used to define field-insulating material, including local oxidation of silicon (LOCOS), depositing of insulating material, and a number of variations on LOCOS, STI, or insulating material deposition. A single active area 22 is illustrated. However, it will be understood that several active areas are typically defined simultaneously by STI across the substrate 10, and that the field insulation often forms a web separating transistor active areas 22 from one another. The substrate is preferably background doped at a level suitable for channel formation in the active area 22.

With continued reference to FIG. 2, a transistor gate electrode 16 is formed over the active area 22. The gate electrode 16 includes a pair of spacers 15 formed around a semiconductor electrode 17, which is covered by a cap layer 19. While illustrated as a traditional semiconductor electrode, surrounded by insulating spacers 15 and a cap layer 19, and separated from the underlying substrate 10 by a gate dielectric layer 18, it will be understood that the transistor gate stack can have any of a variety of configurations. In some process flows, for example, the spacers 15 can be omitted. In the illustrated embodiment, the source/drain regions 20 are formed on either side of the transistor gate electrode 16 within the active area 22. The gate electrode 16 also defines a channel region, in the active area 22, directly under the gate electrode 16 and between the source/drain regions 20. A patterned planarization and tunnel layer 42 (e.g., formed of SiO$_2$) is provided over the gate electrode 16. The layer 42 includes openings 50, which expose the source/drain regions 20.

Figure 3:
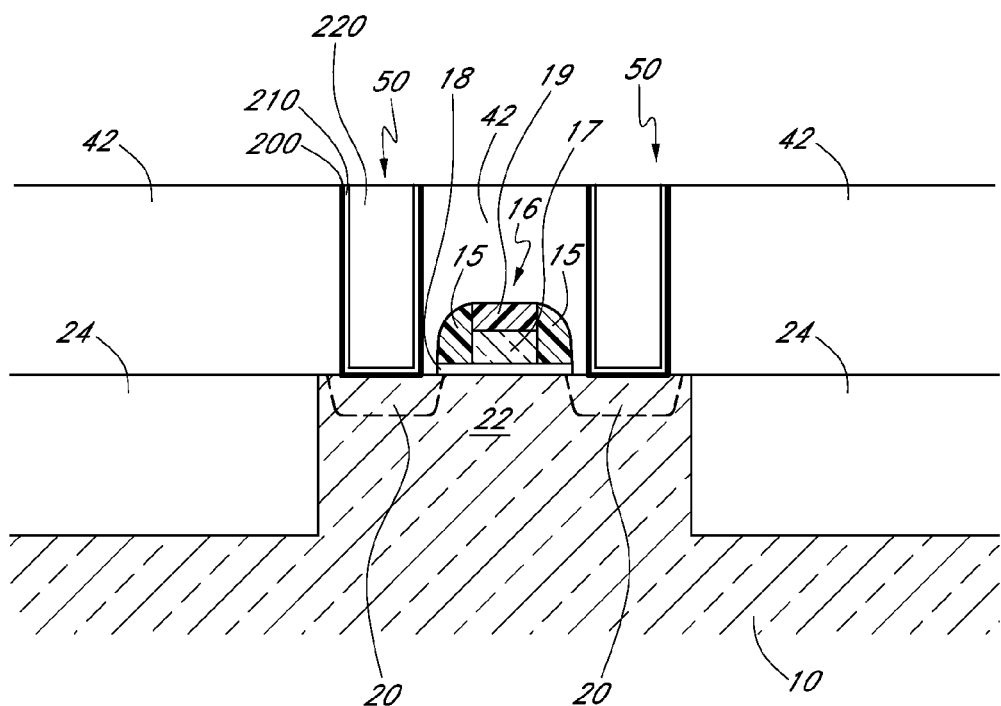
FIG. 3 shows a schematic cross-section of the transistor structure of FIG. 2 after forming a source/drain contact structure, according to some embodiments.

FIG. 3 shows a schematic cross section of the transistor structure of FIG. 2 after forming a source/drain contact structure, according to some embodiments. The surfaces of the openings 50 are exposed to a chalcogen species to form a chalcogen-passivated surface 200, as described herein with respect to block 110 of FIG. 1. A tunnel layer 210 is formed over the passivated surface (as described herein with respect to block 120 of FIG. 1) and the opening 50 is subsequently filled with a metal 220 (as described herein with respect to block 130 of FIG. 1). It will be appreciated that the composition of the tunnel layer 210 may vary, as described herein with respect to FIG. 1.

It will be appreciated that the sequences illustrated by FIGS. 2 and 3 are examples for planar device structures only and that other orders for forming the various illustrated features are contemplated. For example, the source/drain contact structure formed by the chalcogen-passivated surface 200, tunnel layer 210, and metal 220 may be formed before one or more of the other illustrated features. In addition, the methods disclosed herein may be applied to other transistor types that utilize a source/drain contact such as non-planar device structures, including FinFET and Vertical Nanowire/GAA device structures. It will be appreciated that these other transistor types may omit one or more of the illustrated features and/or include additional features.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for integrated circuit fabrication, comprising:
   forming a transistor source/drain contact structure comprising a dielectric tunnel layer and a metal, wherein forming the transistor source/drain contact structure comprises, in order:
   passivating a surface of a semiconductor substrate by exposing the surface to a chalcogen, thereby forming a chalcogen-passivated surface;
   depositing the tunnel layer, wherein depositing the tunnel layer comprises:
   exposing the chalcogen passivated surface to a metalorganic precursor; and
   depositing a remaining portion of the tunnel layer without the metal-organic precursor; and
   depositing the metal over the tunnel layer.

2. The method of claim 1, wherein depositing the tunnel layer comprises:
   exposing the semiconductor substrate to a first set of precursors comprising the metal-organic precursor; and
   subsequently exposing the semiconductor substrate to a second set of precursors comprising a metal or semimetal precursor different from the metal-organic precursor.

3. The method of claim 2, wherein the first set of precursors comprises only the metallorganic precursor.

4. The method of claim 3, wherein exposing the semiconductor substrate to the first set of precursors comprises exposing the substrate to only a single pulse of the metal-organic precursor before subsequently exposing the semiconductor substrate to the second set of precursors.

5. The method of claim 2, wherein the metal-organic precursor comprises a cyclopentadienyl group.

6. The method of claim 2, wherein the first and second sets of precursors each comprise different metals.

7. The method of claim 2, wherein the first set of precursors comprises the metal-organic precursor and an oxygen precursor.

8. The method of claim 7, wherein the second set of precursors comprises the metal or semimetal precursor and an oxygen precursor.

9. The method of claim 7, wherein exposing the semiconductor substrate and subsequently exposing the semiconductor substrate comprise performing atomic layer depositions.

10. The method of claim 9, wherein subsequently exposing the semiconductor substrate comprises subjecting the semiconductor substrate to temporally separated exposures of the metal or semimetal precursor and the oxygen precursor, wherein a ratio of the exposures to the metal or semimetal precursor and exposures to the oxygen precursor vary over time.

11. The method of claim 2, wherein the second set of precursors comprises an inorganic metal precursor or an inorganic semimetal precursor.

12. The method of claim 11, wherein the inorganic metal precursor or the inorganic semimetal precursor is a halide.

13. The method of claim 2, wherein the metal precursor is a metal-organic precursor.

14. The method of claim 1, wherein passivating the semiconductor substrate surface and depositing the tunnel layer are performed in a same deposition chamber.

15. The method of claim 1, wherein depositing the metal comprises performing an atomic layer deposition of the metal.

16. A method for integrated circuit fabrication, comprising:
   forming a transistor, wherein forming the transistor comprises:
   forming a source/drain contact structure over a semiconductor substrate, wherein forming the source/drain contact structure comprises:
   exposing a source/drain region of the transistor to a chalcogen;
   depositing a dielectric layer on the chalcogen-exposed source/drain region, wherein depositing the dielectric layer comprises:
   exposing the substrate to a metal-organic precursor; and
   subsequently depositing a remainder of the dielectric layer by exposing the substrate to a plurality of precursors different from the first metal-organic precursor; and
   forming a metal electrode over the dielectric layer.

17. The method of claim 16, wherein exposing the substrate to the metal-organic precursor is part of an atomic layer deposition.

18. The method of claim 17, wherein performing the atomic layer deposition with the metal-organic precursor deposits no more than a monolayer of material before subsequently depositing a remainder of the dielectric layer by exposing the substrate to a plurality of precursors different from the first metal-organic precursor.

19. The method of claim 17, wherein the plurality of precursors comprises only inorganic precursors.

20. The method of claim 16, wherein the plurality of precursors are atomic layer deposition precursors, wherein exposing the substrate to the plurality of precursors comprises performing an atomic layer deposition with the plurality of precursors.

21. The method of claim 16, wherein the source/drain region comprises silicon, silicon germanium, a group III-V semiconductor, a group II-VI semiconductor, a 2D semiconductor, or combinations thereof.

22. The method of claim 16, wherein the source/drain region comprises germanium.

23. The method of claim 16, wherein the source/drain region comprises n-doped germanium, the dielectric layer comprises titanium oxide, and the metal electrode comprises titanium.

* * * * *

UNITED STATES PATENT AND TRADEMARK OFFICE
CERTIFICATE OF CORRECTION

PATENT NO. : 9,461,134 B1
APPLICATION NO. : 14/717553
DATED : October 4, 2016
INVENTOR(S) : Qi Xie Page 1 of 1

It is certified that error appears in the above-identified patent and that said Letters Patent is hereby corrected as shown below:

On the Title Page

In Column 2 (page 2, item (56)) at line 31, Under Other Publications, change "Schottkey" to --Schottky--.

In the Claims

In Column 9 at Line 44, In Claim 3, change "Metallorganic" to --metal-organic--.

Signed and Sealed this
Tenth Day of January, 2017

Michelle K. Lee
*Director of the United States Patent and Trademark Office*